United States Patent
Kondo et al.

(10) Patent No.: US 12,103,581 B2
(45) Date of Patent: Oct. 1, 2024

(54) SENSING MECHANISM

(71) Applicant: KABUSHIKI KAISHA TOKAI-RIKA-DENKI-SEISAKUSHO, Aichi-ken (JP)

(72) Inventors: Yasumasa Kondo, Aichi-ken (JP); Hiroshi Ohira, Aichi-ken (JP); Taichi Hino, Aichi-ken (JP)

(73) Assignee: KABUSHIKI KAISHA TOKAI-RIKA-DENKI-SEISAKUSHO, Aichi-Ken (JP)

( * ) Notice: Subject to any disclaimer, the term of this patent is extended or adjusted under 35 U.S.C. 154(b) by 880 days.

(21) Appl. No.: 17/191,037

(22) Filed: Mar. 3, 2021

(65) Prior Publication Data
US 2021/0276604 A1   Sep. 9, 2021

(30) Foreign Application Priority Data
Mar. 5, 2020   (JP) .................. 2020-038182

(51) Int. Cl.
*B62D 1/04* (2006.01)
*B60K 28/04* (2006.01)
(Continued)

(52) U.S. Cl.
CPC .............. *B62D 1/04* (2013.01); *B60K 28/04* (2013.01); *B60R 16/02* (2013.01); *D03D 1/0088* (2013.01);
(Continued)

(58) Field of Classification Search
CPC ........ G01R 27/00; G01R 27/02; G01R 27/26; G01R 27/2605; G01D 5/00; G01D 5/12;
(Continued)

(56) References Cited

U.S. PATENT DOCUMENTS

2010/0079153 A1\* 4/2010 Maloof .................. B60K 35/10
324/658
2017/0013705 A1   1/2017 Jahng
(Continued)

FOREIGN PATENT DOCUMENTS

DE   102014117823 A1 \*   6/2016 .............. G01D 5/24
JP       H0415162 A       1/1992
(Continued)

OTHER PUBLICATIONS

Japanese Office Action (w/ Machine translation) for corresponding Application No. 2020-038182, dated Sep. 12, 2023, 9 pages.

*Primary Examiner* — Hoai-An D. Nguyen
(74) *Attorney, Agent, or Firm* — Dority & Manning, P.A.

(57) ABSTRACT

At a sensor electrode of a steering wheel, a protruding portion protrudes from a main body portion. A first thread and a second thread each extend in the protruding portion and effect conduction between a terminal at the protruding portion and a main body portion. Therefore, even if there is no conduction between the first thread and the second thread at intersection portions between the first thread and second thread in the protruding portion, the first thread and the second thread may each effect conduction between the terminal and the main body portion, and a degradation of conduction performance of the sensor electrode may be suppressed.

7 Claims, 5 Drawing Sheets

(51) Int. Cl.
    *B60K 35/60*    (2024.01)
    *B60K 35/65*    (2024.01)
    *B60R 16/02*    (2006.01)
    *D03D 1/00*     (2006.01)
    *D03D 15/567*   (2021.01)
    *G01D 5/24*     (2006.01)
    *H01H 36/00*    (2006.01)
    *H05K 9/00*     (2006.01)

(52) U.S. Cl.
    CPC ............ *D03D 15/567* (2021.01); *G01D 5/24* (2013.01); *H01H 36/00* (2013.01); *H05K 9/009* (2013.01); *B60K 35/60* (2024.01); *B60K 35/65* (2024.01); *B60K 2360/741* (2024.01); *B60K 2360/782* (2024.01); *D10B 2401/16* (2013.01)

(58) Field of Classification Search
    CPC ... G01D 5/14; G01D 5/24; B62D 1/00; B62D 1/02; B62D 1/04; B62D 1/046; B62D 1/06; B62D 1/065; B60K 28/00; B60K 28/02; B60K 28/04; B60K 35/00; B60K 35/60; B60K 35/65; B60K 2360/00; B60K 2360/741; B60K 2360/77; B60K 2360/782; B60R 16/00; B60R 16/02; D03D 1/00; D03D 1/50; D03D 1/567; D10B 2401/00; D10B 2401/16; H01H 36/00; H05K 9/00; H05K 9/0073; H05K 9/0081; H05K 9/009
    USPC ........................................ 324/600, 649, 658
    See application file for complete search history.

(56) References Cited

U.S. PATENT DOCUMENTS

2017/0137050 A1    5/2017  Michelmann et al.
2017/0308239 A1*  10/2017  Higashihara ......... B60N 2/0228
2018/0348392 A1*  12/2018  Nishio ................. B62D 1/046

FOREIGN PATENT DOCUMENTS

JP    H07-290841       11/1995
JP    2010250980 A     11/2010
JP    2010261116 A     11/2010
JP    2018142411 A      9/2018

* cited by examiner

SENSING MECHANISM

CROSS-REFERENCE TO RELATED APPLICATION

This application is based on and claims priority under 35 USC 119 from Japanese Patent Application No. 2020-38182 filed on Mar. 5, 2020, the disclosure of which is incorporated by reference herein.

BACKGROUND

Technical Field

The present invention relates to a sensing mechanism provided with a conductive fabric.

Related Art

An anisotropic conductive fabric recited in Japanese Patent Application Laid-Open (JP-A) No. H07-290841 is structured by a conductive wire and a thread woven together. In this anisotropic conductive fabric, when the conductive wire and the thread have conductivity, conduction performance between the conductive wire and the thread is vulnerable to degradation by external factors (corrosion, external forces and the like) at intersection portions between the conductive wire and the thread.

SUMMARY

In consideration of the circumstances described above, an object of the present invention is to provide a sensing mechanism that may suppress degradation in conduction performance of a conductive fabric.

Solution to Problem

A sensing mechanism according to a first aspect of the present invention comprises: a sensing portion provided at a contact body, the sensing portion configured to sense touching of the contact body by a person; a conductive fabric provided at the sensing portion, the conductive fabric comprising a first thread having conductivity and a second thread having conductivity, which are woven; a main body portion provided at the conductive fabric; a protruding portion provided at the conductive fabric, the protruding portion protruding from the main body portion in a direction that is different from an extension direction of the first thread and an extension direction of the second thread; and a terminal provided at the protruding portion, at least one of the first thread or the second thread extending in the protruding portion and effecting conduction between the terminal and the main body portion.

In the sensing mechanism according to the first aspect of the present invention, the sensing portion of the contact body senses touching of the contact body by a person. The conductive fabric is provided at the sensing portion and comprises the first thread having conductivity and the second thread having conductivity, which are woven. In the conductive fabric, the protruding portion protrudes from the main body portion in the direction that is different from the extension direction of the first thread and the extension direction of the second thread, and the terminal is provided at the protruding portion.

At least one of the first thread or the second thread extends in the protruding portion and effects conduction between the terminal and the main body portion. Therefore, even if there is no conduction between the first thread and the second thread at an intersection portion between the first thread and the second thread in the protruding portion, at least one of the first thread or the second thread may effect conduction between the terminal and the main body portion. Thus, a degradation in conduction performance of the conductive fabric may be suppressed.

In a sensing mechanism according to a second aspect of the present invention, the sensing mechanism according to the first aspect of the present invention further comprises a widening portion provided at the protruding portion, the widening portion widening the protruding portion in a protrusion width direction, and at least one of the first thread or the second thread extending in the widening portion and effecting conduction between the terminal and the main body portion.

In the sensing mechanism according to the second aspect of the present invention, the widening portion of the protruding portion widens the protruding portion in the protrusion width direction. At least one of the first thread or the second thread extends in the widening portion and effects conduction between the terminal and the main body portion. Therefore, even when a protrusion dimension of the protruding portion is large, at least one of the first thread or the second thread extending in the protruding portion may effect conduction between the terminal and the main body portion.

In a sensing mechanism according to a third aspect of the present invention, in the sensing mechanism according to the first aspect or the second aspect of the present invention, the conductive fabric is stretched in a direction that is different from the extension direction of the first thread and the extension direction of the second thread.

In the sensing mechanism according to the third aspect of the present invention, because the conductive fabric is stretched in the direction that is different from the extension direction of the first thread and the extension direction of the second thread, the conductive fabric may be stretched easily.

BRIEF DESCRIPTION OF THE DRAWINGS

Exemplary embodiments of the present invention will be described in detail based on the following figures, wherein.

DETAILED DESCRIPTION

Figure 1:
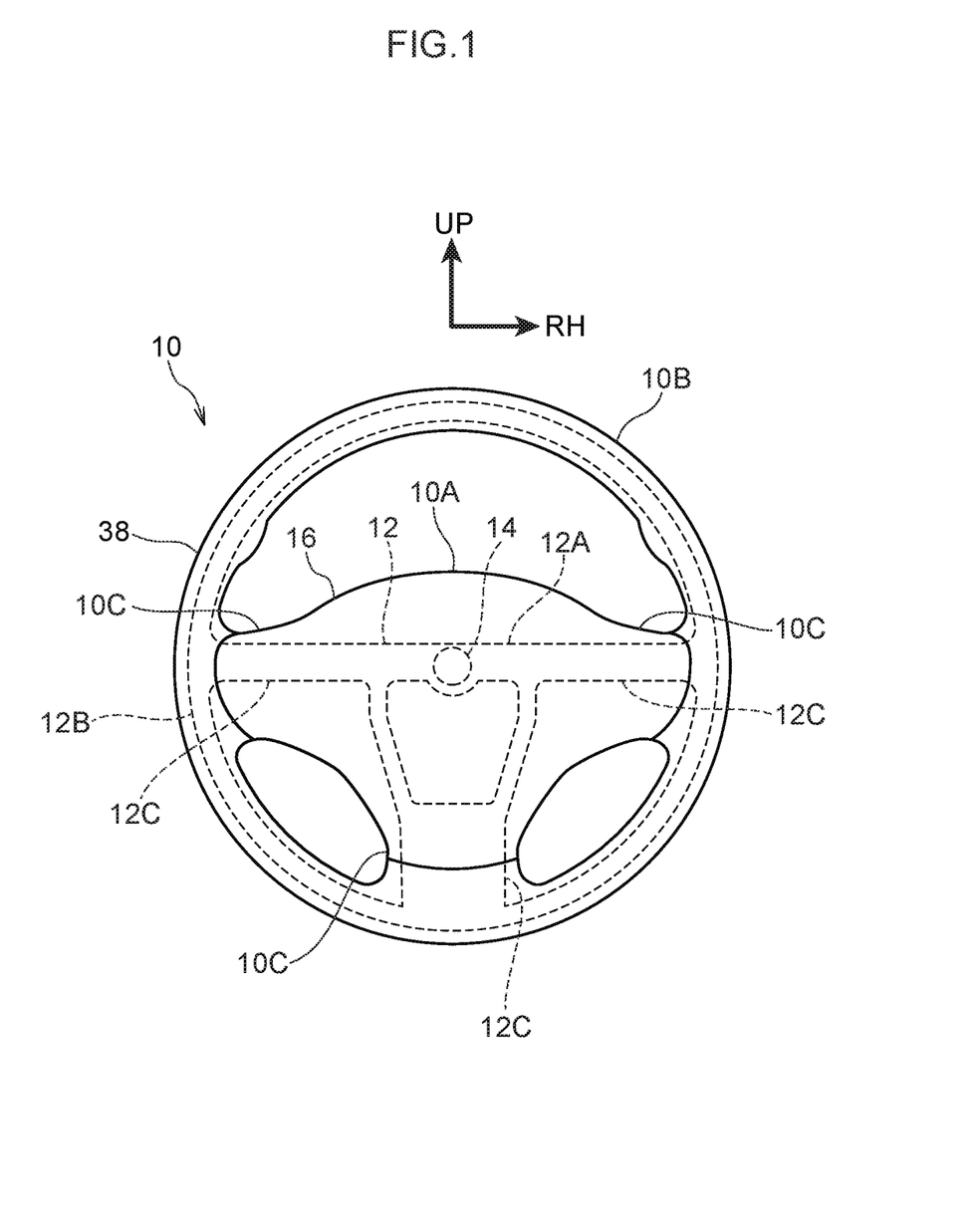
FIG. 1 is a front view showing a steering wheel according to an exemplary embodiment of the present invention from a front side.
Figure 2A:
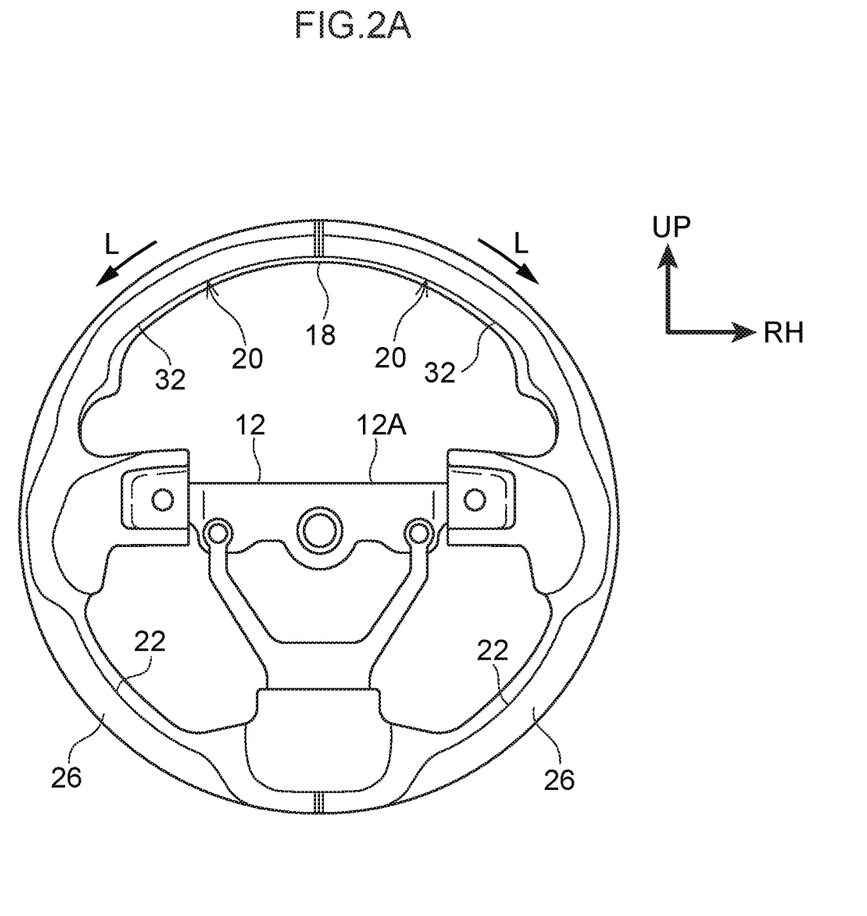
FIG. 2A is a front view showing principal portions of the steering wheel according to the exemplary embodiment of the present invention from the front side.
Figure 2B:
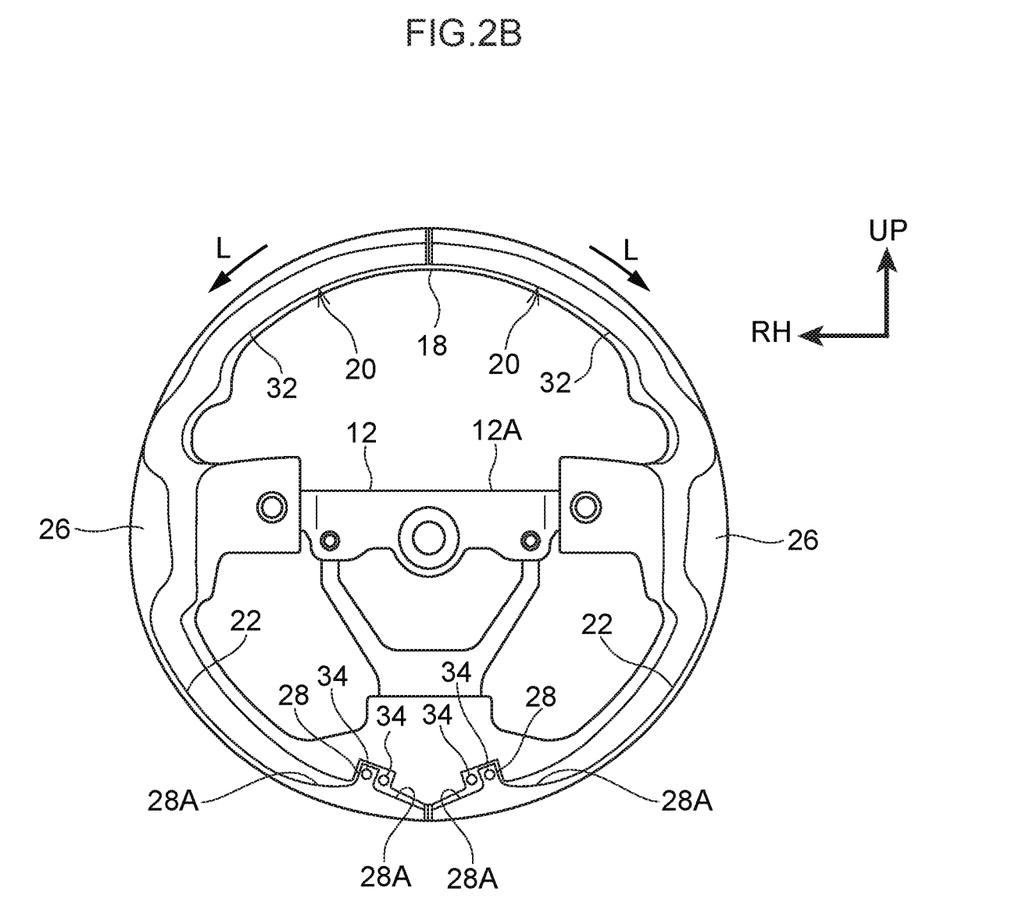
FIG. 2B is a rear view showing the principal portions of the steering wheel according to the exemplary embodiment of the present invention from the rear side.

FIG. 1 is a front view showing a steering wheel 10 according to an exemplary embodiment of the present invention, which serves as a contact body, from a front side thereof. In the drawings, the front side of the steering wheel 10 is indicated by arrow FR, a right side of the steering wheel 10 is indicated by arrow RH, and an upper side of the steering wheel 10 is indicated by arrow UP.

The steering wheel 10 according to the present exemplary embodiment opposes a driver seat of a vehicle, which is at a vehicle rear side of the steering wheel 10. The steering wheel 10 is disposed at the vehicle front side of a vehicle occupant (a driver, who is a touching person) sitting on the driver seat. The front side, right side and upper side of the steering wheel 10 are oriented to, respectively, the rear side, right side and upper side of the vehicle.

As shown in FIG. 1, a boss portion 10A that serves as a fixed portion is provided at a central region of the steering wheel 10. A rim portion 10B with an annular shape in front view, which serves as a contact portion, is provided at an outer periphery region of the steering wheel 10. Three spoke portions 10C that serve as connection portions are provided between the boss portion 10A and the rim portion 10B. The spoke portions 10C protrude to the left side, right side and lower side from the boss portion 10A and connect the boss portion 10A with the rim portion 10B.

A core grid 12 fabricated of metal that serves as a framework member is provided at the steering wheel 10.

A boss core 12A in a plate shape is provided at a central region of the core grid 12. The boss core 12A structures the boss portion 10A. The boss core 12A is fixed to a vehicle rear side end (vehicle upper side end) of a circular rod-shaped steering shaft 14 of the vehicle, which serves as a support shaft. The steering shaft 14 is disposed to be concentric with the rim portion 10B. The steering wheel 10 (the core grid 12) is supported at the steering shaft 14 to be turnable integrally therewith. When the vehicle occupant holds the rim portion 10B and operates to turn the steering wheel 10 in the circumferential direction thereof, the steering shaft 14 turns about the central axis thereof and the vehicle is steered.

A rim core 12B with an annular shape in front view is provided at an outer periphery region of the core grid 12. The rim core 12B structures the rim portion 10B. Three spoke cores 12C in long, narrow plate shapes are provided between the boss core 12A and the rim core 12B. The spoke cores 12C protrude from the boss core 12A to the left side, right side and lower side (to outer sides in the diametric direction of the steering wheel 10). The spoke cores 12C integrally connect the boss core 12A with the rim core 12B, and structure the spoke portions 10C.

A plate-shaped pad 16 that serves as a covering member is provided at the boss portion 10A and the spoke portions 10C. The pad 16 is provided at the front sides of the boss core 12A and the spoke cores 12C, covering the front sides of the boss core 12A and the spoke cores 12C.

An interior member 18 with an annular shape in front view that serves as a mounting member (see FIG. 3) is provided at the whole of the rim portion 10B in a length direction of the rim portion 10B (the circumferential direction of the steering wheel 10) and a perimeter direction of the rim portion 10B (a direction encircling the length direction). The interior member 18 is fabricated of a soft resin (for example, polyurethane). An exterior shape of the interior member 18 in a cross section orthogonal to the length direction is a circular shape. The rim core 12B is accommodated inside the interior member 18, and the interior member 18 is fixed to the rim core 12B.

A sensor 20 substantially in a long, narrow, rectangular sheet shape (see FIG. 2A, FIG. 2B, FIG. 3 and FIG. 4) is provided at each of a left side region and a right side region of the rim portion 10B. Each sensor 20, which serves as a sensing portion constituting a sensing mechanism, is adhered to the outer periphery of the interior member 18. A length direction of the sensor 20 is curved and arranged along the length direction of the rim portion 10B. One length direction side (the direction of arrow L in FIG. 4) of the sensor 20 is oriented to the length direction lower side of the rim portion 10B. A width direction of the sensor 20 is curved and arranged along the perimeter direction of the rim portion 10B. One width direction side (the direction of arrow W in FIG. 4) of the sensor 20 is oriented to the perimeter direction rear side of the rim portion 10B. The width direction middle of the sensor 20 is disposed at the outer side of the rim portion 10B in the diameter direction of the steering wheel 10. Both width direction ends of the sensor 20 are disposed at the inner side of the rim portion 10B in the diameter direction of the steering wheel 10.

Figure 4:
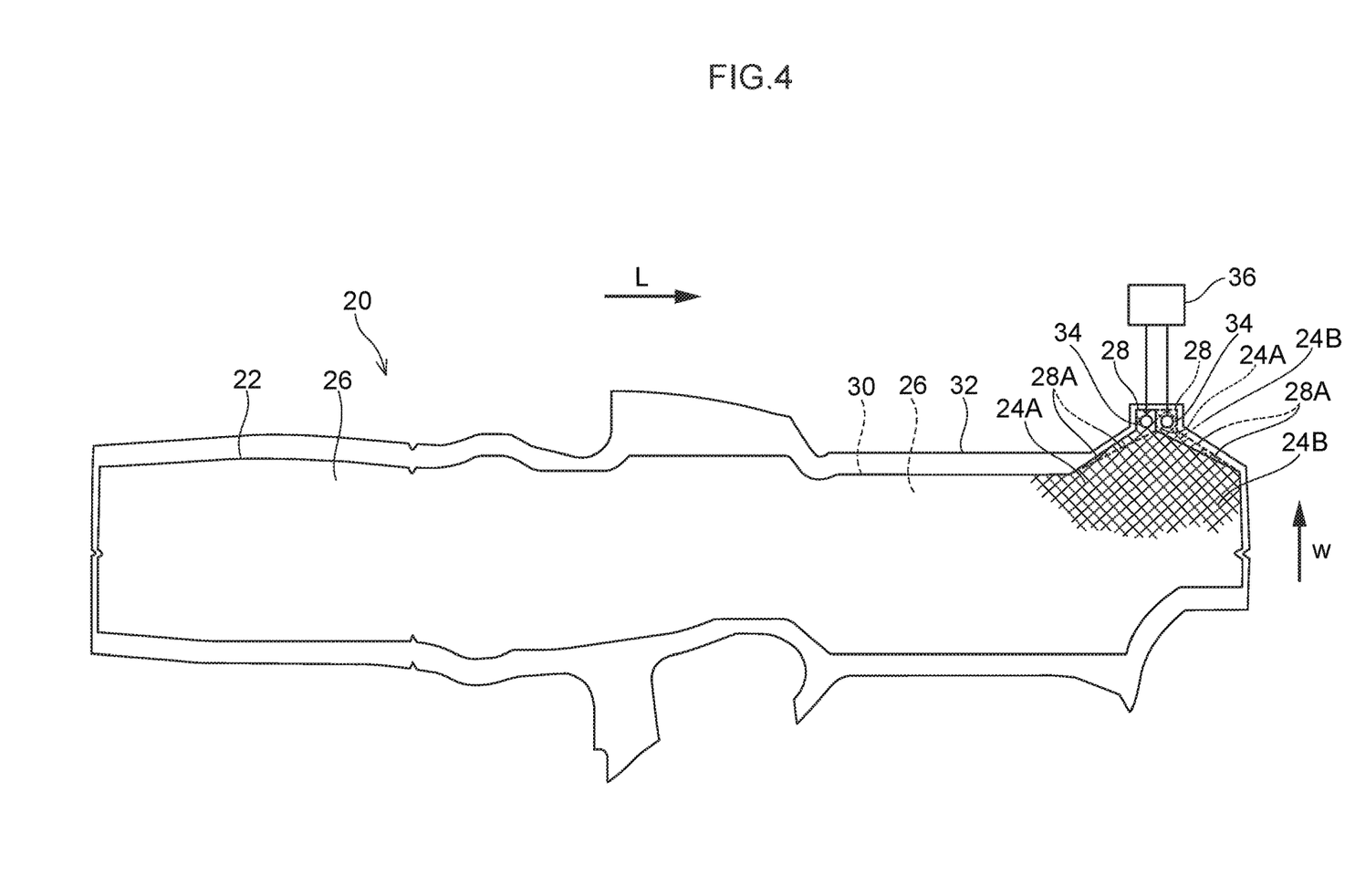
FIG. 4 is an expansion view showing a sensor of the steering wheel according to the exemplary embodiment of the present invention from a face side.

A sensor electrode 22 substantially in a long, narrow, rectangular fabric shape is provided at a face side region (an outer side region in a diameter direction of the rim portion 10B) of the sensor 20. The sensor electrode 22 serves as a conductive fabric (a sensor portion). One length direction side and one width direction side of the sensor electrode 22 are oriented to, respectively, the one length direction side and the one width direction side of the sensor 20.

Each sensor electrode 22 is structured by a first thread 24A (one of a warp and a weft) and a second thread 24B (the other of the warp and the weft) being woven. In FIG. 4, a schematic of the first thread 24A and the second thread 24B in a portion of the sensor electrode 22 is shown. An arrangement spacing of the first thread 24A and an arrangement spacing of the second thread 24B are depicted in FIG. 4 as being larger than in actuality. Metal plating is formed at outer peripheries of the first thread 24A and the second thread 24B. Thus, the first thread 24A and the second thread 24B feature conductivity and conduct electricity at intersection portions. The first thread 24A is inclined in a direction to the one width direction side of the sensor electrode 22 toward the one length direction side of the sensor electrode 22. The second thread 24B is inclined in a direction to the one width direction side of the sensor electrode 22 toward the other length direction side of the sensor electrode 22. The first thread 24A and the second thread 24B are angled at, for example, 45° relative to the length direction and width direction of the sensor electrode 22. The sensor electrode 22 is not stretchable in an extension direction of the first thread 24A and an extension direction of the second thread 24B, but the sensor electrode 22 is stretchable in a direction that is different from the extension direction of the first thread 24A and the extension direction of the second thread 24B. Thus, the sensor electrode 22 is stretched in the length direction.

A main body portion 26 substantially in a long, narrow rectangular shape is provided at the sensor electrode 22. A length direction and width direction of the main body portion 26 are arranged along, respectively, the length direction and width direction of the sensor electrode 22.

A protruding portion 28 in a substantially triangular shape is provided at one length direction side portion of the sensor electrode 22. The protruding portion 28 protrudes from the main body portion 26 to one width direction side (one stretching width direction side) of the sensor electrode 22. A protrusion distal end portion of the protruding portion 28 is formed in a rectangular shape. Widening portions 28A in triangular shapes are provided at the protruding portion 28, at both of side regions thereof in a protrusion width direction (the length direction of the sensor electrode 22), but are not provided at the protrusion distal end portion. The widening portions 28A widen the protruding portion 28 in the protrusion width direction. Inclination angles, relative to the length direction of the sensor electrode 22, of ends of the widening portions 28A that are at the protrusion width direction outer sides of the protruding portion 28 are smaller than the inclination angles of the first thread 24A and the second thread 24B (45° in this example). Between the protrusion distal end portion of the protruding portion 28 and the main body portion 26, the first thread 24A extends through the widening portion 28A that is at the other length direction side of the sensor electrode 22, and the second thread 24B extends through the widening portion 28A that is at the one length direction side of the sensor electrode 22.

A shield electrode 30 substantially in a long, narrow, rectangular fabric shape that serves as a conductive fabric (a shield portion) is provided at a back side region of the sensor 20 (an inner side region in the diameter direction of the rim portion 10B). The shield electrode 30 has a substantially similar structure to the sensor electrode 22. Similarly to the sensor electrode 22, the main body portion 26 and the protruding portion 28 are provided at the shield electrode 30. A protrusion distal end portion of the protruding portion 28 of the shield electrode 30 is disposed further to the one length direction side of the sensor 20 than the protrusion distal end portion of the protruding portion 28 of the sensor electrode 22.

Figure 3:
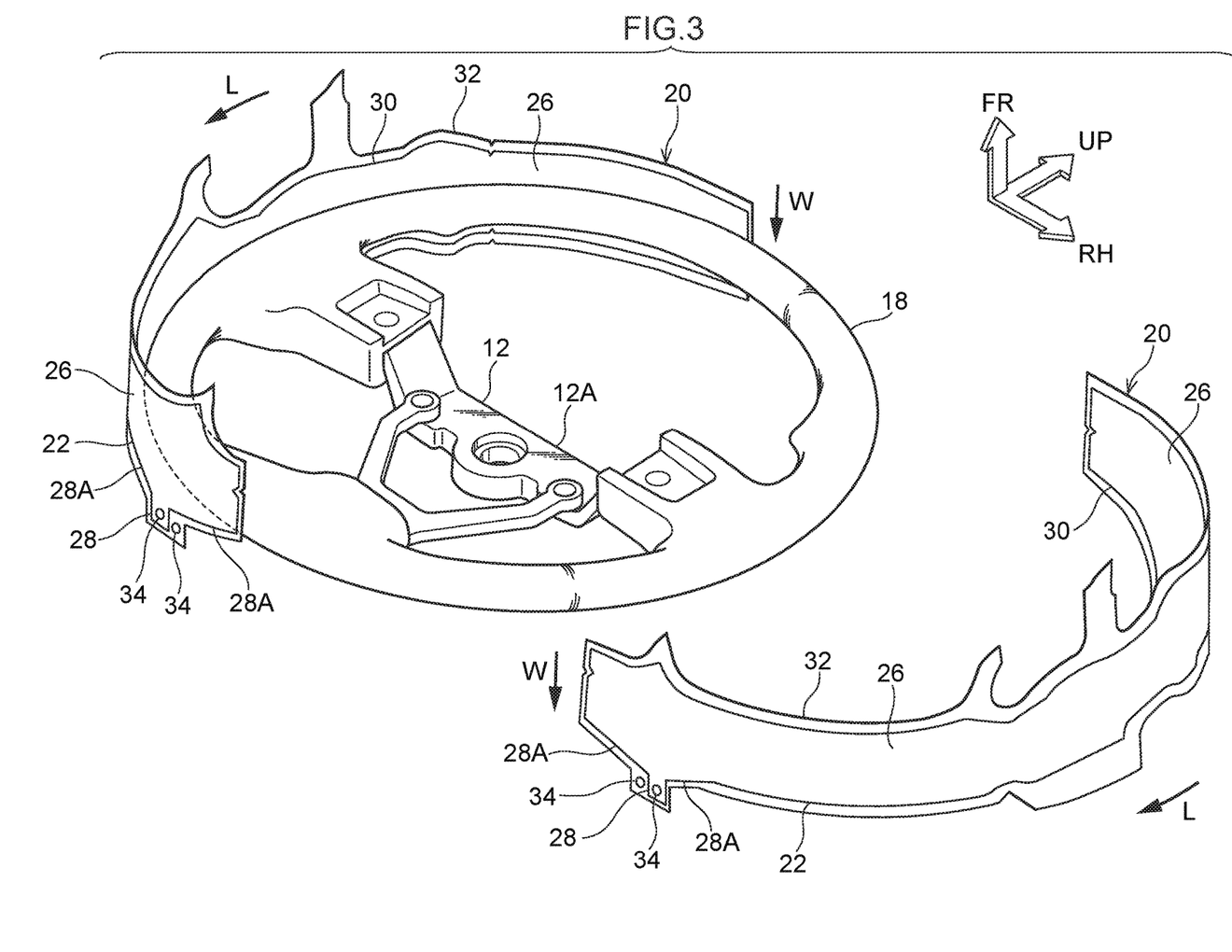
FIG. 3 is an exploded perspective view showing the principal portions of the steering wheel according to the exemplary embodiment of the present invention from the front side.

An insulating body 32 substantially in a long, narrow, rectangular sheet shape that serves as an insulating portion is provided between the sensor electrode 22 and the shield electrode 30. One length direction side and one width direction side of the insulating body 32 are oriented to, respectively, the one length direction side and the one width direction side of the sensor 20. The insulating body 32 is fabricated of resin and the sensor electrode 22 and shield electrode 30 are fixed to the insulating body 32. Thus, the insulating body 32 electrically insulates the sensor electrode 22 from the shield electrode 30. The insulating body 32 is formed to be resiliently stretchable in all directions, and is stretched in the length direction together with the sensor electrode 22 and the shield electrode 30.

Terminals 34 fabricated of metal are provided at a position of the protrusion distal end portion of the protruding portion 28 of each sensor electrode 22 and a position of the protrusion distal end portion of the protruding portion 28 of each shield electrode 30. Each terminal 34 is formed as a rivet, penetrates through the sensor 20 and is crimped to the sensor 20. Thus, the terminals 34 are fixed to the sensor 20. The terminal 34 at the other length direction side of the sensor 20 is conductively connected with the protrusion distal end portion of the protruding portion 28 of the sensor electrode 22. The first thread 24A of the sensor electrode 22 extends through the widening portion 28A at the other length direction side of the sensor electrode 22 and effects conduction between this terminal 34 and the main body portion 26 of the sensor electrode 22. The second thread 24B of the sensor electrode 22 extends through the widening portion 28A at the one length direction side of the sensor electrode 22 and effects conduction between this terminal 34 and the main body portion 26 of the sensor electrode 22. The terminal 34 at the one length direction side of the sensor 20 is conductively connected with the protrusion distal end portion of the protruding portion 28 of the shield electrode 30. The first thread 24A of the shield electrode 30 extends through the widening portion 28A at the other length direction side of the shield electrode 30 and effects conduction between this terminal 34 and the main body portion 26 of the shield electrode 30. The second thread 24B of the shield electrode 30 extends through the widening portion 28A at the one length direction side of the sensor electrode 22 and effects conduction between this terminal 34 and the main body portion 26 of the shield electrode 30. Each terminal 34 is electronically connected with a control device 36 (an ECU) of the vehicle.

A skin 38 that serves as an outer periphery member is provided over the whole of the outer periphery of the rim portion 10B. The skin 38 covers the sensors 20 and constitutes a face side surface (a diameter direction outer side surface) of the rim portion 10B.

Now, operation of the present exemplary embodiment is described.

In the steering wheel 10 with the structure described above, in each of the sensor electrodes 22 and shield electrodes 30 of the sensors 20 of the rim portion 10B, the first thread 24A and the second thread 24B extend at angles relative to the length direction and width direction of the sensor 20, and the protrusion distal end portion of the protruding portion 28 is electronically connected with the control device 36 via the terminal 34.

When a vehicle occupant holds the rim portion 10B of the steering wheel 10 and a hand of the vehicle occupant touches the face side surface of the skin 38 of the rim portion 10B, a capacitance produced between the hand of the vehicle occupant and the main body portion 26 of the sensor electrode 22 is detected at the control device 36. Thus, the holding of the rim portion 10B by the vehicle occupant (the hand touching against the skin 38) is detected. Control is performed by the control device 36 to equalize the potentials of the sensor electrode 22 and the shield electrode 30. Therefore, the production of a parasitic capacitance between the main body portion 26 of the sensor electrode 22 and the rim core 12B is restricted by the main body portion 26 of the shield electrode 30, and a change caused by this parasitic capacitance in the capacitance produced between the hand of the vehicle occupant and the main body portion 26 of the sensor electrode 22 is suppressed. Thus, a reduction in detection accuracy of holding of the rim portion 10B by the vehicle occupant is suppressed.

In each of the sensor electrodes 22 and shield electrodes 30, the protruding portion 28 protrudes to the one width direction side of the main body portion 26 (in a direction that is different from the extension direction of the first thread 24A and the extension direction of the second thread 24B). The first thread 24A and the second thread 24B extend in the protruding portion 28 and effect conduction between the terminal 34 of the protruding portion 28 and the main body portion 26. Therefore, in the protruding portion 28 whose dimension in the length direction of the sensor 20 is smaller than the main body portion 26, even if there is no conduction between the first thread 24A and the second thread 24B at intersection portions between the first thread 24A and second thread 24B in the protruding portion 28 due to an external factor (corrosion, an external force or the like), the first thread 24A and the second thread 24B may each effect conduction between the terminal 34 and the main body portion 26. Thus, conduction failures between the terminals 34 and the main body portions 26 may be suppressed, and degradations in conduction performance of the sensor electrodes 22 and shield electrodes 30 may be suppressed. Therefore, holding of the rim portion 10B by a vehicle occupant may be excellently sensed by the main body portion 26 of each sensor electrode 22, and the production of a parasitic capacitance between the main body portion 26 of the sensor electrode 22 and the rim core 12B may be excellently restricted by the main body portion 26 of the shield electrode 30.

In each of the sensor electrodes 22 and shield electrodes 30, the widening portions 28A of the protruding portion 28 widen the protruding portion 28 in the protrusion width direction, the first thread 24A and the second thread 24B extend in the respective widening portions 28A, and the first thread 24A and the second thread 24B effect conduction between the terminal 34 and the main body portion 26. Therefore, even when a protrusion dimension of the protruding portion 28 is large, the first thread 24A and the second thread 24B may each extend in the protruding portion 28 and effect conduction between the terminal 34 and the main body portion 26.

Each sensor 20 (the sensor electrode 22, the shield electrode 30 and the insulating body 32) is stretched in the length direction that is a different direction from the extension direction of the first thread 24A and the extension direction of the second thread 24B. Therefore, the sensor 20 may be easily stretched in the length direction, and the sensor 20 may be provided at the rim portion 10B in a state in which the sensor 20 (particularly the main body portions 26 of the sensor electrode 22 and the shield electrode 30) is stretched in the length direction thereof along the length direction of the rim portion 10B.

In each of the sensor electrodes 22 and shield electrodes 30 of the present exemplary embodiment, the first thread 24A and the second thread 24B respectively extend in the protruding portion 28 and effect conduction between the terminal 34 at the protruding portion 28 and the main body portion 26. However, it is acceptable if at least one of the first thread 24A or second thread 24B in the sensor electrode 22 or shield electrode 30 extends in the protruding portion 28 and effects conduction between the terminal 34 at the protruding portion 28 and the main body portion 26.

In the present exemplary embodiment, the sensor 20 is provided at the steering wheel 10 (the contact body). However, it is possible to provide the sensor 20 at a contact body other than the steering wheel 10 (for example, a seat of a vehicle).

In the present exemplary embodiment, the sensor electrode 22, the shield electrode 30 and the insulating body 32 are provided at each sensor 20. However, it is sufficient that the sensor electrode 22 be provided at the sensor 20; the shield electrode 30 and the insulating body 32 need not be provided.

What is claimed is:

1. A sensing mechanism, comprising:
    a sensing portion provided at a contact body, the sensing portion configured to sense touching of the contact body by a person;
    a conductive fabric provided at the sensing portion, the conductive fabric comprising a first thread having conductivity and a second thread having conductivity, which are woven;
    a main body portion provided at the conductive fabric;
    a protruding portion provided at the conductive fabric, the protruding portion protruding from the main body portion in a direction that is different from an extension direction of the first thread and an extension direction of the second thread; and
    a terminal provided at the protruding portion, at least one of the first thread or the second thread extending in the protruding portion and effecting conduction between the terminal and the main body portion.

2. The sensing mechanism according to claim 1, further comprising a widening portion provided at the protruding portion, the widening portion widening the protruding portion in a protrusion width direction, and at least one of the first thread or the second thread extending in the widening portion and effecting conduction between the terminal and the main body portion.

3. The sensing mechanism according to claim 2, wherein an inclination angle of an end of the widening portion relative to the main body portion is smaller than an inclination angle, relative to the main body portion, of at least one of the extension direction of the first thread or the extension direction of the second thread.

4. The sensing mechanism according to claim 2, wherein the widening portion is provided at both sides of the protruding portion in the protrusion width direction.

5. The sensing mechanism according to claim 1, wherein the conductive fabric is stretched in a direction that is different from the extension direction of the first thread and the extension direction of the second thread.

6. The sensing mechanism according to claim 1, wherein the direction of protruding of the protruding portion is orthogonal to a stretched direction of the conductive fabric.

7. The sensing mechanism according to claim 1, wherein the conductive fabric is curved in a stretched direction.

* * * * *